US006750947B1

(12) United States Patent
Tomita et al.

(10) Patent No.: US 6,750,947 B1
(45) Date of Patent: Jun. 15, 2004

(54) DRIVING DEVICE AND EXPOSURE APPARATUS

(75) Inventors: Hiroyuki Tomita, Utsunomiya (JP); Ryuichi Ebinuma, Toyko (JP); Makoto Mizuno, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 145 days.

(21) Appl. No.: 09/590,182

(22) Filed: Jun. 9, 2000

(30) Foreign Application Priority Data

Jun. 16, 1999 (JP) .......................................... 11-169542

(51) Int. Cl.⁷ ........................ G03B 27/68; G03B 27/52; G02B 15/14; G02B 7/02
(52) U.S. Cl. ...................... 355/52; 355/55; 359/695; 359/811; 359/813; 359/823; 359/826
(58) Field of Search .................... 355/52, 55; 359/696, 359/823, 813, 811, 826, 827, 828

(56) References Cited

U.S. PATENT DOCUMENTS

| | | | |
|---|---|---|---|
| 3,704,657 A | * 12/1972 | Sliwkowski et al. | .......... 355/53 |
| 4,676,631 A | 6/1987 | Kosugi et al. | ............... 355/55 |
| 4,907,021 A | 3/1990 | Yabu | ...................... 353/101 |
| 4,999,506 A | 3/1991 | Mizusawa et al. | ....... 250/491.1 |
| 5,150,151 A | 9/1992 | Mochizuki et al. | ........... 355/53 |
| 5,822,133 A | 10/1998 | Mizuno et al. | ............. 359/696 |

FOREIGN PATENT DOCUMENTS

JP         9-106944       4/1997

* cited by examiner

Primary Examiner—Rodney Fuller
(74) Attorney, Agent, or Firm—Fitzpatrick, Cella, Harper & Scinto

(57) ABSTRACT

A driving device includes a first member, an annular second member arranged outside the first member, an annular first plate for connecting the first and second members to each other, and an annular second plate for connecting the first and second members to each other. The first and second members are moved relative to each other by supplying or exhausting a fluid into or from a space surrounded by the first and second members and the first and second plates. Also, at least one of (i) an inner diameter a1 of a portion of the second member at which the second member is connected to the first plate is different from an inner diameter a2 of a portion of the second member at which the second member is connected to the second plate and (ii) an outer diameter b1 of a portion of the first member at which the first member is connected to the first plate is different from an outer diameter b2 of a portion of the first member at which the first member is connected to the second plate.

36 Claims, 18 Drawing Sheets

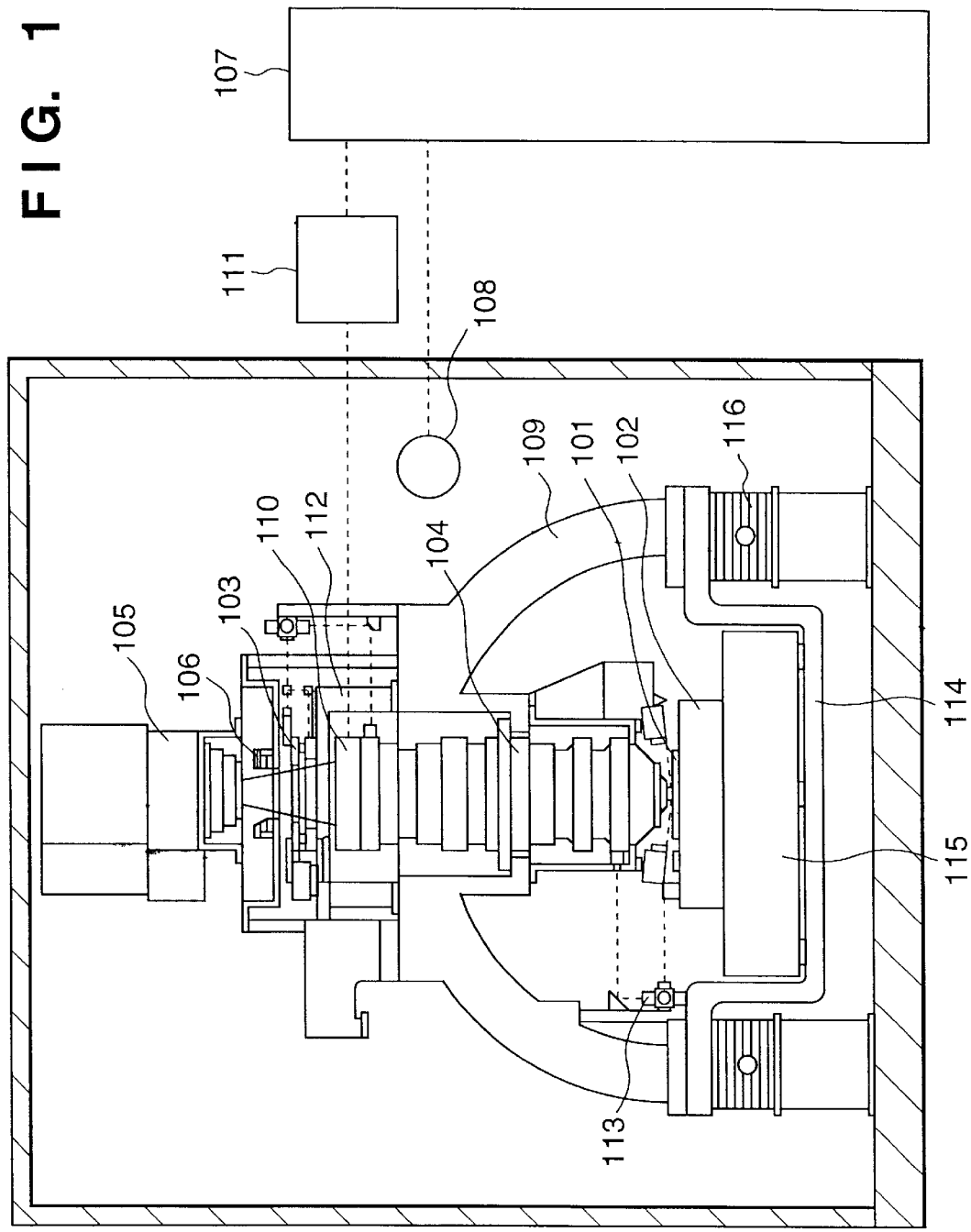

$a1<a2, b1<b2, a1-b1 \neq a2-b2$ $a1>a2, b1>b2, a1-b1 \neq a2-b2$

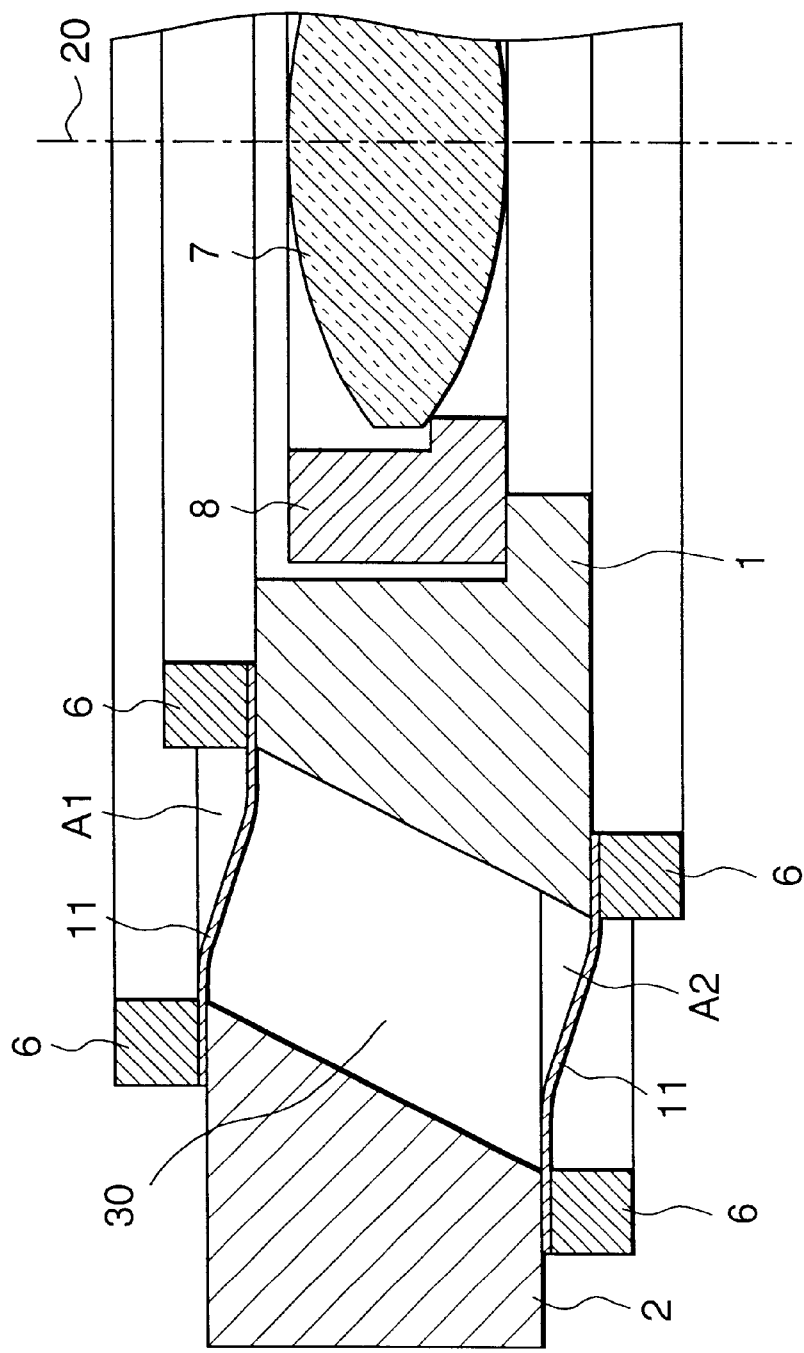

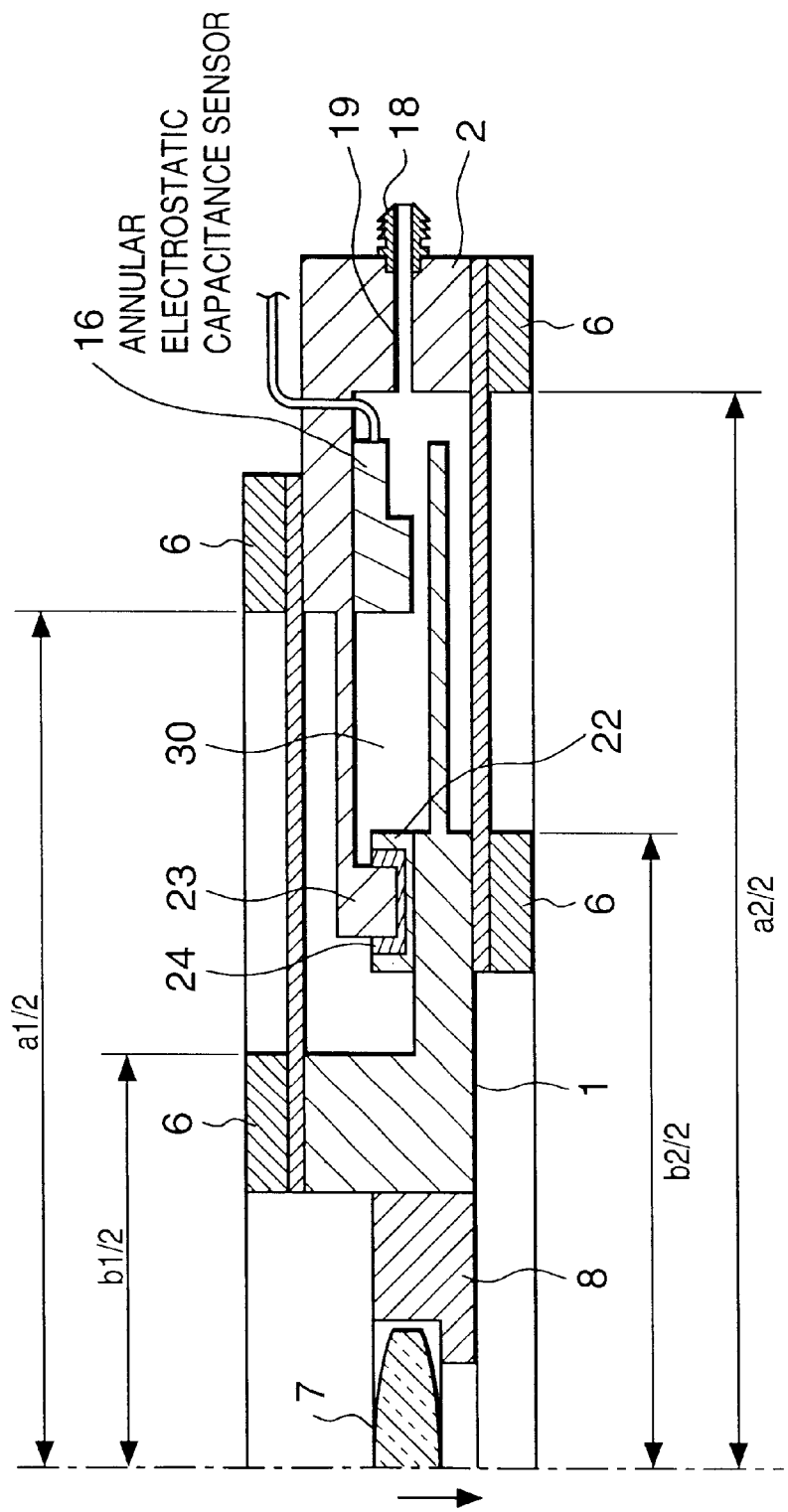

14 ANNULAR ELECTROSTATIC CAPACITANCE SENSOR

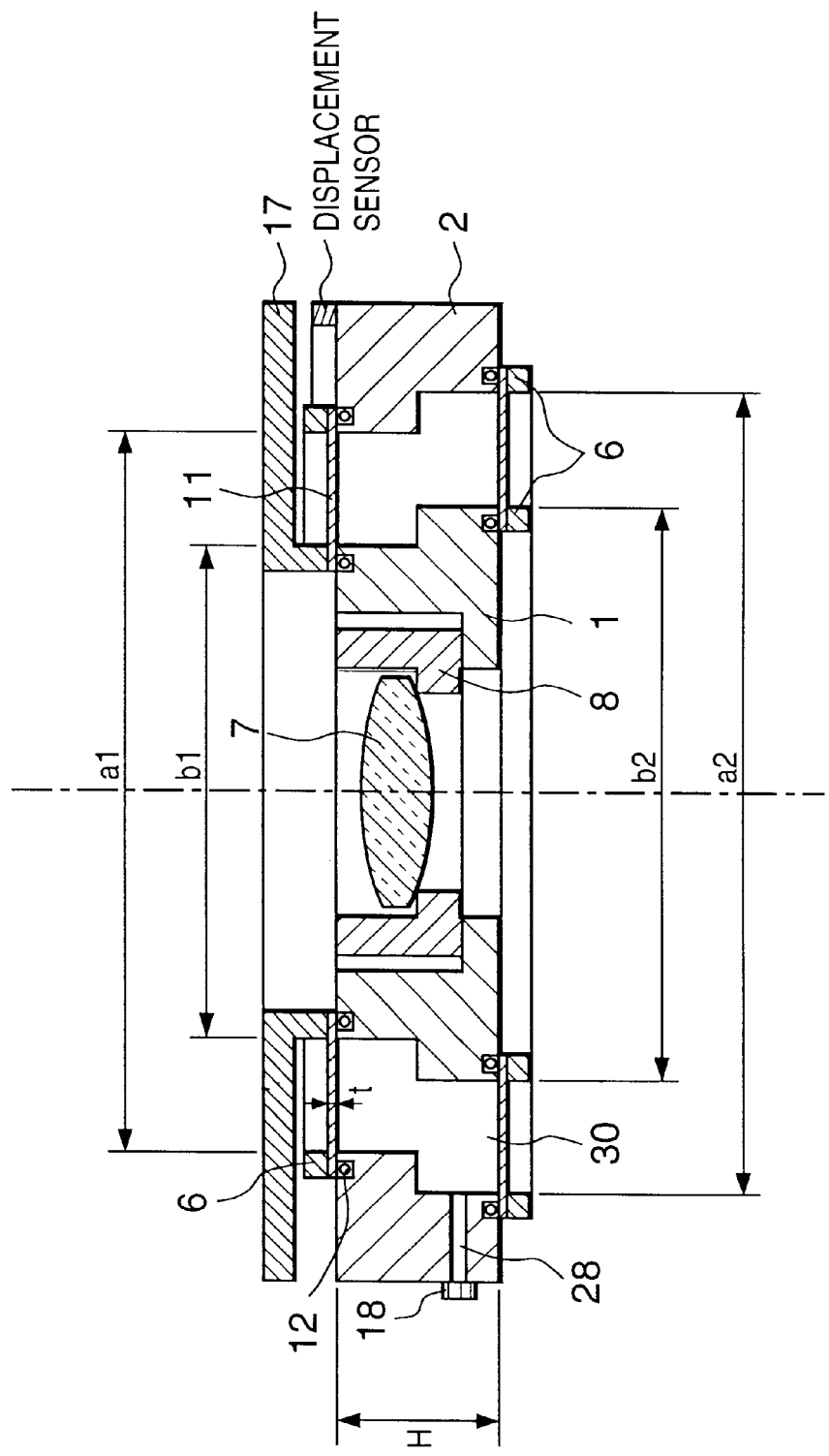

a1<a2, b1<b2, a1−b1≠a2−b2 a1>a2, b1>b2, a1−b1≠a2−b2

DRIVING DEVICE AND EXPOSURE APPARATUS

FIELD OF THE INVENTION

The present invention relates to a driving apparatus suitable for precise position adjustment of members and an exposure apparatus including this driving device and, more particularly, to a driving device for adjusting the optical characteristics, such as magnification, aberration, and distortion, of a projection optical system which can be mounted on an exposure apparatus and the like, and an exposure apparatus including this driving device. The present invention is applicable to an optical apparatus serving as an additional optical system in an exposure apparatus, such as a semiconductor exposure apparatus, for accurately forming an image when projecting and exposing the image of an original plate (e.g., a mask and reticle) onto a target (e.g., a wafer), and an exposure apparatus including this optical apparatus.

BACKGROUND OF THE INVENTION

A semiconductor exposure apparatus transfers different patterns formed on a plurality of original plates (reticles) onto a silicon wafer (substrate) in an overlaying manner. To form a high-integration circuit, an increase in not only resolution performance but also overlay accuracy is indispensable.

Factors causing overlay errors in the semiconductor exposure apparatus are classified into an alignment error, image distortion, and magnification error. The alignment error is reduced by adjusting the positions of the original plate (reticle) and the substrate (wafer) relative to each other. The magnification error can be adjusted by moving at least one optical element of the projection optical system in the direction of the optical axis. When moving the optical element in the direction of the optical axis, components other than the moving direction, particularly parallel eccentricity and a tilt error, of the optical element should be kept small.

Conventionally, as a projecting magnification adjusting device for a semiconductor exposure apparatus, an optical element moving device having a mechanism using parallel leaf springs is proposed (Japanese Patent Laid-Open No. 9-106944).

FIGS. 17A and 17B are plan and sectional views, respectively, of a conventional optical element moving device.

As shown in FIGS. 17A and 17B, the conventional optical element moving device has a movable table 1 for holding an adjustment lens 7 which adjusts the magnification, aberration, and the like of an optical system, and a cell 8 which supports the adjustment lens 7, and a stationary table 2 which forms part of the stationary portion of the projection optical system. A driving element 4 is comprised of bellows 9 and the like. One end of the driving element 4 is fixed to the stationary table 2, and the other end thereof is fixed to a clamp top plate 5 connected to the movable table 1. The movable and stationary tables 1 and 2 are connected to each other through a spring mechanism having a plurality of sets of opposing leaf springs 3 and a plurality of leaf spring retainers 6 for supporting the leaf springs 3. The driving element 4 is arranged in a gap between the plurality of sets of leaf springs 3 arranged on the movable table 1 to be equidistant from its center and symmetric with respect to an optical axis 20.

FIG. 18 shows the driving element 4 in detail.

The driving element 4 is constituted by the bellows 9 and two flanges 10a and 10b. The flange 10a is connected to the clamp top plate 5 at the gap between a plurality of sets of leaf springs 11. The other flange 10b is arranged in the stationary table 2 to transmit an air pressure applied to the interior of the bellows 9 to the movable table 1.

When a heavy, large-diameter movable portion such as a lens is driven by a mechanism utilizing leaf springs, since the eigenfrequency is low, the movable portion is largely vibrated by a disturbance or the like. To improve the transfer performance of the exposure apparatus, the mechanism desirably has a high eigenfrequency.

SUMMARY OF THE INVENTION

It is an object of the present invention to provide a high-precision driving device.

A driving device according to the first aspect of the present invention comprises a first member, an annular second member arranged outside the first member, an annular first plate for connecting the first and second members to each other, an annular second plate for connecting the first and second members to each other, and a fluid controller for supplying or exhausting a fluid into or from a space surrounded by the first and second members and the first and second plates, thereby moving the first and second members relative to each other. As a result, at least one of the first and second members can be driven at high precision.

A volume in the space can change as the first and second members move relative to each other.

The first and second members can move relative to each other in a direction substantially parallel to an axial direction of the annular second member. The first and second members can move relative to each other in a direction substantially parallel to a direction of gravity.

The first and second plates preferably have different shapes.

Either one of a1≠a2 and b1≠b2 is preferably satisfied where a1 is an inner diameter of a portion of the second member at which the second member is connected to the first plate, a2 is an inner diameter of a portion of the second member at which the second member is connected to the second plate, b1 is an outer diameter of a portion of the first member at which the first member is connected to the first plate, and b2 is an outer diameter of a portion of the first member at which the first member is connected to the second plate. In this case, (a1−b1) and (a2−b2) are further preferably substantially equal to each other.

A gas such as an inert gas is preferably used as the fluid.

The fluid controller preferably has a pressure control valve for controlling a pressure in the space.

The driving device preferably has a sensor for detecting a relative distance or displacement between the first and second members. The fluid controller preferably controls the pressure control valve, which controls the pressure in the space, on the basis of an output signal from the sensor. A target for the sensor preferably has an annular shape. A fixing member for fixing either one of the first and second plates to either one of the first and second members preferably also serves as the target for the sensor. The fixing member may have a portion formed by welding a metal to a nonconductive material. The sensor may be arranged in the space. The sensor may be, e.g., an electrostatic capacitance sensor.

The driving device preferably has a damper between the first and second members. The damper may have a piston, cylinder, and viscous substance. The damper may be arranged in the space.

The first member may have a step structure on its outer side surface. The second member may have a step structure on its inner side surface.

The first and second members may move relative to each other within a range having as one boundary a position where rigidity of the first and second plates and a mass of at least one of the first and second members balance with each other. Alternatively, the first and second members may move relative to each other within a range including a position where rigidity of the first and second plates and a mass of at least one of the first and second members balance with each other.

A driving device according to the second aspect of the present invention for driving a first member and an annular second member, which is arranged outside the first member, relative to each other, comprises an annular electrode formed on at least one of the first and second members, and a detector for detecting a change in electrostatic capacitance concerning the electrode upon movement of the electrode, thereby detecting positions of the first and second members relative to each other. As a result, since the electrostatic capacitance concerning the electrode can be increased, the change in electrostatic capacitance upon movement of the electrode can be increased. Accordingly, the position detection precision can be improved.

A driving device according to the third aspect of the present invention comprises a first member, a second member arranged outside the first member, a first plate for connecting the first and second members to each other, a second plate for connecting the first and second members to each other, and a fluid controller for supplying or exhausting a fluid into or from a space surrounded by the first and second members and the first and second plates, thereby moving the first and second members relative to each other.

A driving device according to the fourth aspect of the present invention comprises a first member for supporting an optical element, an annular second member arranged outside the first member, an annular first plate for connecting the first and second members to each other, an annular second plate for connecting the first and second members to each other, and a fluid controller for supplying or exhausting a fluid into or from a space surrounded by the first and second members and the first and second plates, thereby moving the first member. As a result, the optical element can be driven at high precision.

A driving device according to the fifth aspect of the present invention comprises a first member for supporting an optical element, a second member arranged outside the first member, a first plate for connecting the first and second members to each other, a second plate for connecting the first and second members to each other, and a fluid controller for supplying or exhausting a fluid into or from a space surrounded by the first and second members and the first and second plates, thereby moving the first member. As a result, the optical element can be driven at high precision.

An exposure apparatus according to the sixth aspect of the present invention comprises a projection system and a driving device for driving at least one optical element of the projection optical system. The driving device has a first member for supporting the optical element, an annular second member arranged outside the first member, an annular first plate for connecting the first and second members to each other, an annular second plate for connecting the first and second members to each other, and a fluid controller for supplying or exhausting a fluid into or from a space surrounded by the first and second members and the first and second plates, thereby moving the first member. As a result, a high-precision exposure apparatus can be provided.

An exposure apparatus according to the seventh aspect of the present invention comprises a projection optical system and a driving device for driving at least one optical element of the projection optical system. The driving device has a first member for supporting the optical element, a second member arranged outside the first member, a first plate for connecting the first and second members to each other, a second plate for connecting the first and second members to each other, and a fluid controller for supplying or exhausting a fluid into or from a space surrounded by the first and second members and the first and second plates, thereby moving the first member. As a result, a high-precision exposure apparatus can be provided.

A device manufacturing method according to the eighth aspect of the present invention comprises the steps of controlling a driving device to arrange at least one optical element of a projection optical system of an exposure apparatus at an appropriate position, and transferring a pattern onto a device material by utilizing the exposure apparatus, the driving device having a first member for supporting the optical element, an annular second member arranged outside the first member, an annular first plate for connecting the first and second members to each other, an annular second plate for connecting the first and second members to each other, and a fluid controller for supplying or exhausting a fluid into or from a space surrounded by the first and second members and the first and second plates, thereby moving the first member. As a result, a precise device can be manufactured.

A device manufacturing method according to the ninth aspect of the present invention comprises the steps of controlling a driving device to arrange at least one optical element of a projection optical system of an exposure apparatus at an appropriate position, and transferring a pattern onto a device material by using the exposure apparatus, the driving device having a first member for supporting the optical element, a second member arranged outside the first member, a first plate for connecting the first and second members to each other, a second plate for connecting the first and second members to each other, and a fluid controller for supplying or exhausting a fluid into or from a space surrounded by the first and second members and the first and second plates, thereby moving the first member. As a result, a precise device can be manufactured.

Other features and advantages of the present invention will be apparent from the following description taken in conjunction with the accompanying drawings, in which like reference characters designate the same or similar parts throughout the figures thereof.

BRIEF DESCRIPTION OF THE DRAWING

The accompanying drawings, which are incorporated in and constitute a part of the specification, illustrate embodiments of the invention and, together with the description, serve to explain the principles of the invention.

FIG. 1 is a front view of an exposure apparatus having an optical element moving device according to the present invention;

FIG. 4 is a view for explaining the principle of operation;

FIG. 5 is a view for explaining the arrangement of a damper;

FIG. 12 is a view showing an optical element moving mechanism according to the second embodiment of the present invention;

DETAILED DESCRIPTION OF THE PREFERRED EMBODIMENTS

[First Embodiment]

Figure 2A:
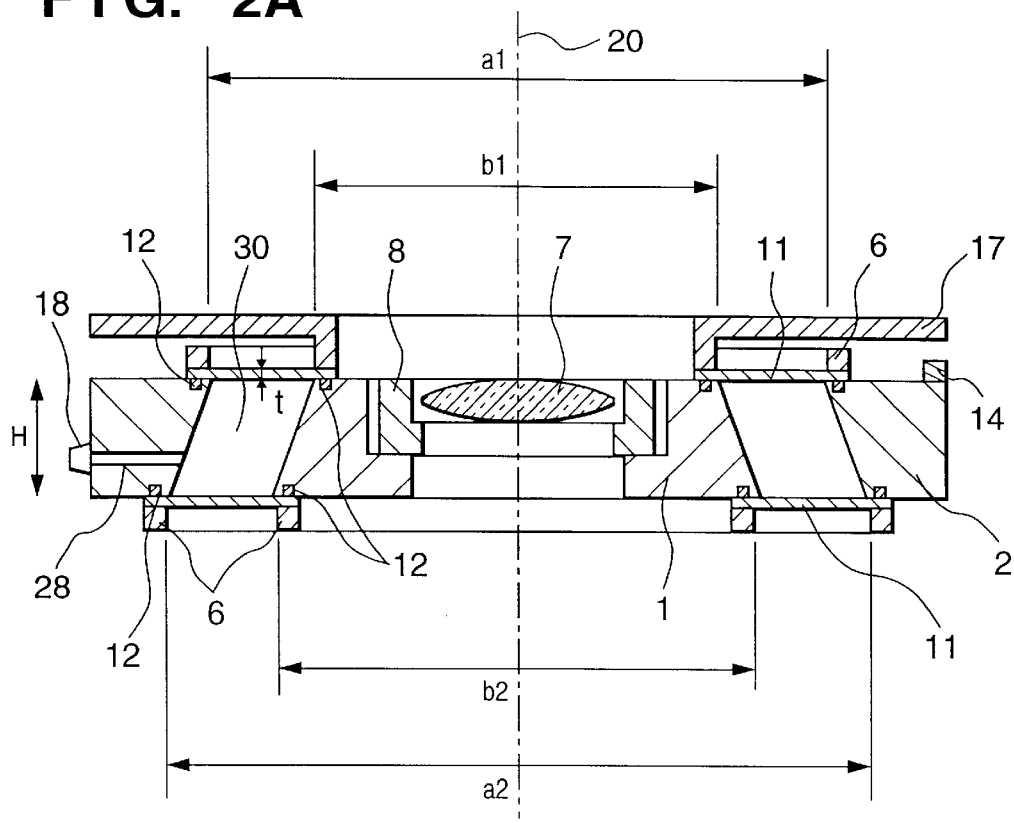
FIGS. 2A and 2B are views showing an optical element moving mechanism according to the first embodiment of the present invention.

FIG. 1 is a schematic view of an exposure apparatus to which the present invention is applied.

Referring to FIG. 1, reference numeral 101 denotes a semiconductor wafer coated with a photosensitive agent and supported on a wafer stage 102 having a precise positioning performance. The position of the wafer stage 102 with respect to the exposure apparatus as a reference is measured by a laser interferometer 113. Reference numeral 103 denotes a reticle serving as an original plate on which a pattern is drawn. A projection optical system 104 has an optical element moving mechanism 110 and forms the pattern of the reticle 103 on the semiconductor wafer 101. Reference numeral 105 denotes an illumination optical system for illuminating the reticle 103; and 106, an alignment optical system for detecting a positional error between the wafer, formed in the pre-process, and the reticle. The pattern on the reticle 103 and the pattern on the semiconductor wafer 101 are overlaid by the alignment optical system 106 and wafer stage 102, and are exposed. Reference numeral 107 denotes a control unit for managing the operation of the exposure apparatus.

The size of the pattern on the wafer can be measured by using a measurement value detected by the alignment optical system 106 and laser interferometer 113 while controlling the driving operation of the wafer stage 102. On the basis of this measurement value, the control unit 107 sets a position for the optical element with which preferable optical characteristics can be obtained. Factors that vary the projecting magnification as one of the optical characteristics of the projection optical system 104 include an atmospheric pressure. The control unit 107 determines a suitable position of at least one optical element, such as the projecting magnification adjustment lens 7, of the projection optical system 104 on the basis of information on the atmospheric pressure obtained by an atmospheric pressure sensor 108 or the like and a suitable exposure magnification, and supplies a position instruction to an optical element controller 111 which controls the optical element moving mechanism 110.

Referring to FIG. 1, reference numeral 109 denotes a barrel surface plate for supporting the projection optical system 104; 112, an upper surface plate supported by the barrel surface plate 109 to support the illumination optical system 105 and alignment optical system 106; and 114, a lower surface plate for supporting a stage base 115 which supports the wafer stage 102. Transmission of vibration between the barrel surface plate 109 and lower surface plate 114, and the floor is disconnected by dampers 116.

Figure 2B:
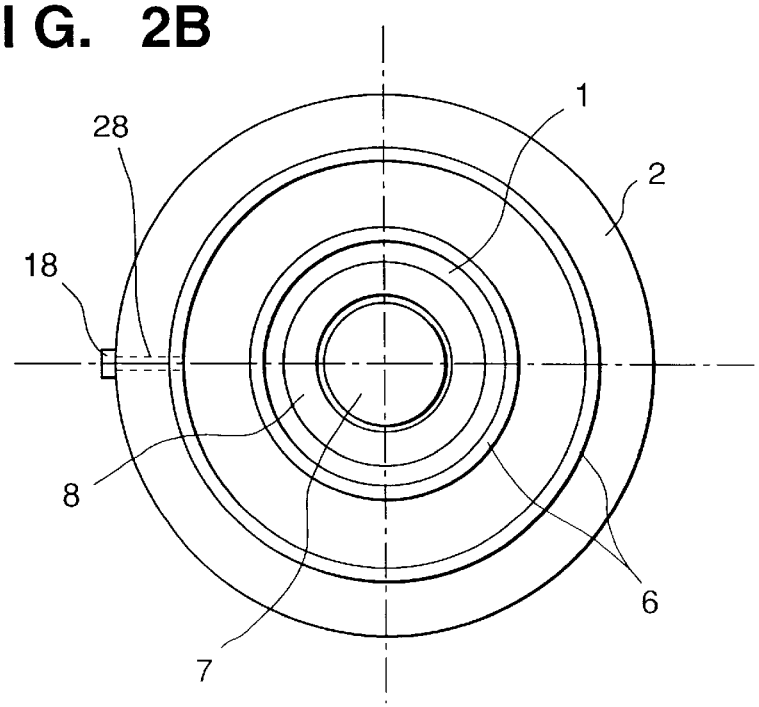

FIG. 2A is a sectional view of an optical element moving mechanism according to the first embodiment of the present invention, and FIG. 2B is a plan view of this optical element moving mechanism.

As shown in FIGS. 2A and 2B, the optical element moving mechanism has a movable table 1 (first member) provided with an adjustment lens 7 for adjusting the magnification, aberration, and the like and a cell 8 for supporting the adjustment lens 7, and a stationary table 2 (second member) forming part of the stationary portion of the projection optical system 104 (shown in FIG. 1). The movable table 1 and stationary table 2 are almost cylindrical. Two annular leaf springs 11 are respectively connected to the ends of the movable table 1 and stationary table 2 by using O-rings 12 and leaf spring retainers 6. The two annular leaf springs 11, O-rings 12, leaf spring retainers 6, movable table 1, and stationary table 2 form a space serving as a driving fluid sealing portion.

The cell 8 for supporting the adjustment lens 7 mounted in the movable table 1 is not integral with the movable table 1 so a force that the movable table 1 receives from the annular leaf springs 11 will not be transmitted to the adjustment lens 7 to distort it.

The movable table 1 is almost cylindrical but its upper and lower surfaces have different outer diameters. Similarly, the stationary table 2 is almost cylindrical but its openings in its upper and lower surfaces have different diameters.

Assuming that the outer diameters of the upper and lower surfaces of the movable table 1 are b1 and b2 and that the inner diameters of the upper and lower surfaces of the stationary table 2 are a1 and a2, b1, b2, a1, and a2 satisfy relations (1):

$$b1 \neq b2 \text{ and } a1 \neq a2 \qquad (1)$$

More specifically, the outer diameters of the upper and lower surfaces of the movable table 1 are not equal to each other, and the inner diameters of the upper and lower surfaces of the stationary table 2 are not equal to each other.

Operating conditions are set at values with which the volume of an annular space 30 defined by the movable table 1 and stationary table 2 changes as the movable table 1 and stationary table 2 move relative to each other, and are substantially expressed by the following relation (2):

$$(a2-b2)(7b2+3a2)-(a1-b1)(7b1+3a1)+10(b2-b1)(b2+b1) \neq 0 \qquad (2)$$

Examples of the operating conditions expressed by relation (2) are:

$$a1 < a2 \text{ and } b1 < b2 \qquad (3)$$

$$a1 > a2 \text{ and } b1 > b2 \qquad (4)$$

More specifically, when (i) the lower outer diameter of the movable table 1 is larger than the upper outer diameter of the movable table 1 and the lower inner diameter of the stationary table 2 is larger than the upper dinner diameter of the stationary table 2, or (ii) the upper outer diameter of the movable table 1 is larger than the lower outer diameter of the movable table 1 and the upper inner diameter of the stationary table 2 is larger than the lower upper diameter of the stationary table 2, relation (2) is established.

Figure 3A:
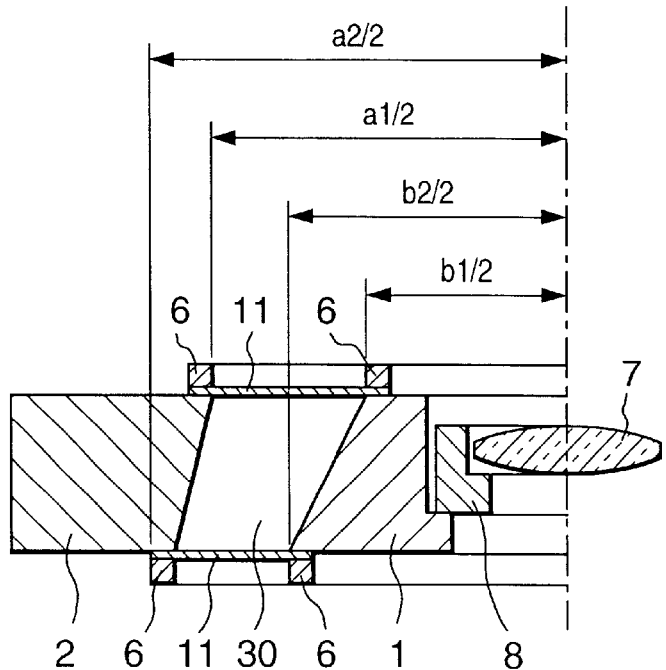
FIGS. 3A and 3B are views for explaining the lengths of leaf springs.
Figure 3B:
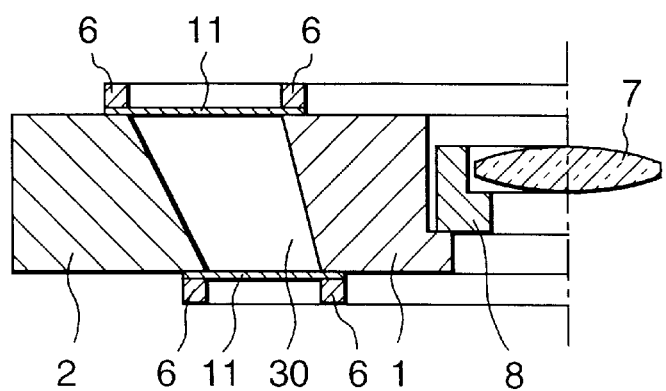

FIG. 3A shows a sectional view of the mechanism when a1<a2 and b1<b2, and FIG. 3B shows a sectional view of a mechanism when a1>a2 and b1>b2.

In addition to the conditions (4), the structure shown in FIG. 2A also satisfies the condition of equation (5):

$$a1-b1=a2-b2 \quad (5)$$

As in conditions (3) (the case of FIG. 3A), when the lower inner and outer diameters in the direction of the optical axis are respectively larger than the upper inner and outer diameters, the movable table 1 is displaced downward along the optical axis. Inversely, as in conditions (4) (the case of FIG. 3B), when the upper inner and outer diameters in the direction of the optical axis are respectively larger than the lower inner and outer diameters, the movable table 1 is displaced upward along the optical axis.

The stationary table 2 has at least one hole 28 communicating with the space 30. When the pressure of the driving fluid in the space 30, or the volume of the space 30, is changed by utilizing the hole 28, the position of the movable table 1 can be changed. This is because since the diameters of the two leaf springs 11 are different from each other as shown in FIG. 4, volume change amounts A1 and A2 of the upper and lower portions, respectively, of the space 30 produced by deformation of the leaf springs 11 are different from each other.

In the case of this optical element moving mechanism, since the fluid sealing portion (space) 30 serving as the actuator is formed at one portion, it suffices if one fluid adjusting equipment, e.g., pressure controller, is provided. This fluid adjusting equipment is controlled by the optical element controller 111.

As an example, with the condition of equation (5), a moving amount x of the movable table 1 is substantially expressed by equation (6):

$$x=P(a-b)^3(b2-b1)/(32Et^3) \quad (6)$$

where P is the pressure applied to the driving portion (space 30), (a-b) is equal to (a1-b1)=(a2-b2), E is the Young's modulus of the annular leaf springs 11, and t is the thickness of the annular leaf springs 11. Note that in equation (6), the dimensional range is set so that the leaf springs 11 can be regarded as beams.

The larger the difference between the outer diameter of the movable table 1 and the inner diameter of the stationary table 2, the larger the displacement amount x of the movable table 1 with respect to the driving pressure P. This signifies that the larger the difference between the outer diameter of the movable table 1 and the inner diameter of the stationary table 2, the larger the adjustment range can be.

In the above example, the difference between the inner diameter of the upper surface of the stationary table 2 and the outer diameter of the upper surface of the movable table 1 is equal to the difference between the inner diameter of the lower surface of the stationary table 2 and the outer diameter of the lower surface of the movable table 1, that is, (a1−b1)=(a2−b2). However, the above description also applies to a case wherein the former difference is not equal to the latter difference.

In actual size design, the eigenfrequency of the optical element moving mechanism according to the present invention can be set higher than that of the optical element moving mechanism of the prior art. This signifies that the optical element moving mechanism according to the present invention is resistant to a disturbance (vibration externally applied during a period when the exposure apparatus is in use can be blocked highly and vibration during transfer in the exposure apparatus can be blocked highly), and that an adverse vibratory influence that the exposure apparatus applies to other units while the exposure apparatus is in use can be reduced.

Figure 6A:
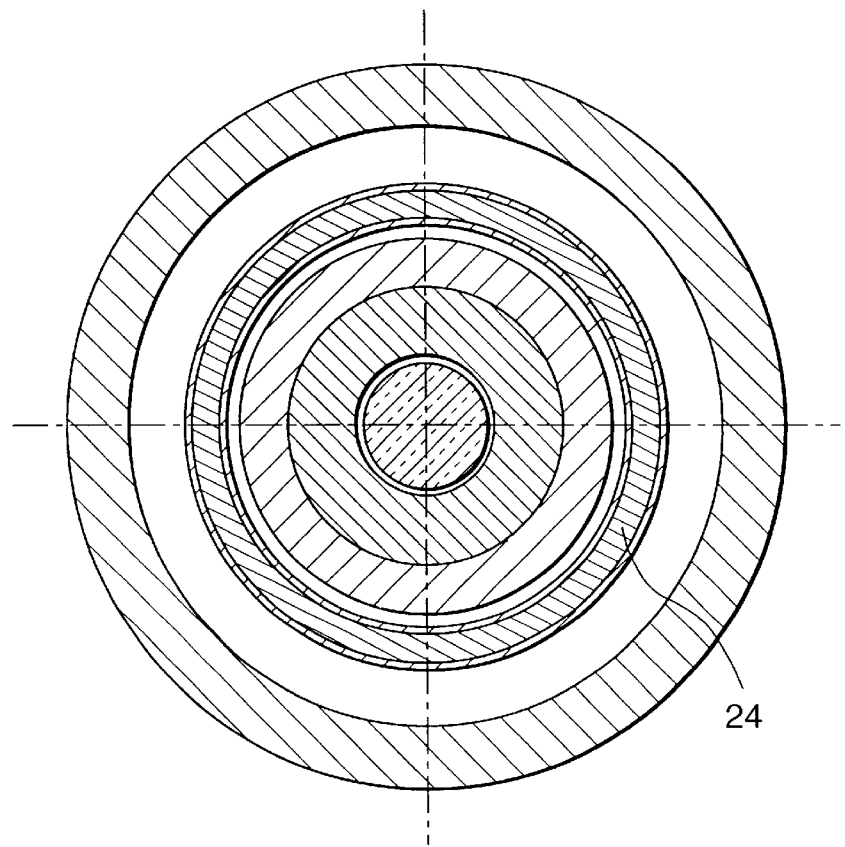
FIGS. 6A and 6B are views for explaining a damper arranged circularly.
Figure 6B:
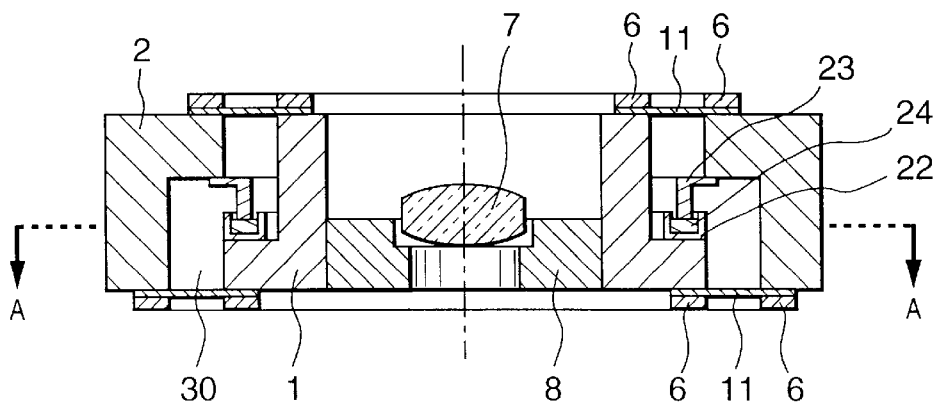

If the eigenfrequency is low or the attenuation ratio is low and accordingly the position of the movable table 1 is not settled stably, or if the exposure apparatus applies an adverse vibratory influence to other units, it is effective to add a damper. This damper can be formed by providing a cylinder 22 and piston 23 in the driving fluid sealing portion 30 and arranging a viscous substance 24 such as grease or oil between them, as shown in FIG. 5 and FIGS. 6A and 6B. The cylinder 22 and piston 23 may be circular in the fluid sealing portion 30 or be formed at several portions separately. If the damper is arranged in the driving fluid sealing portion 30, it is efficient in terms of space.

Figure 7:
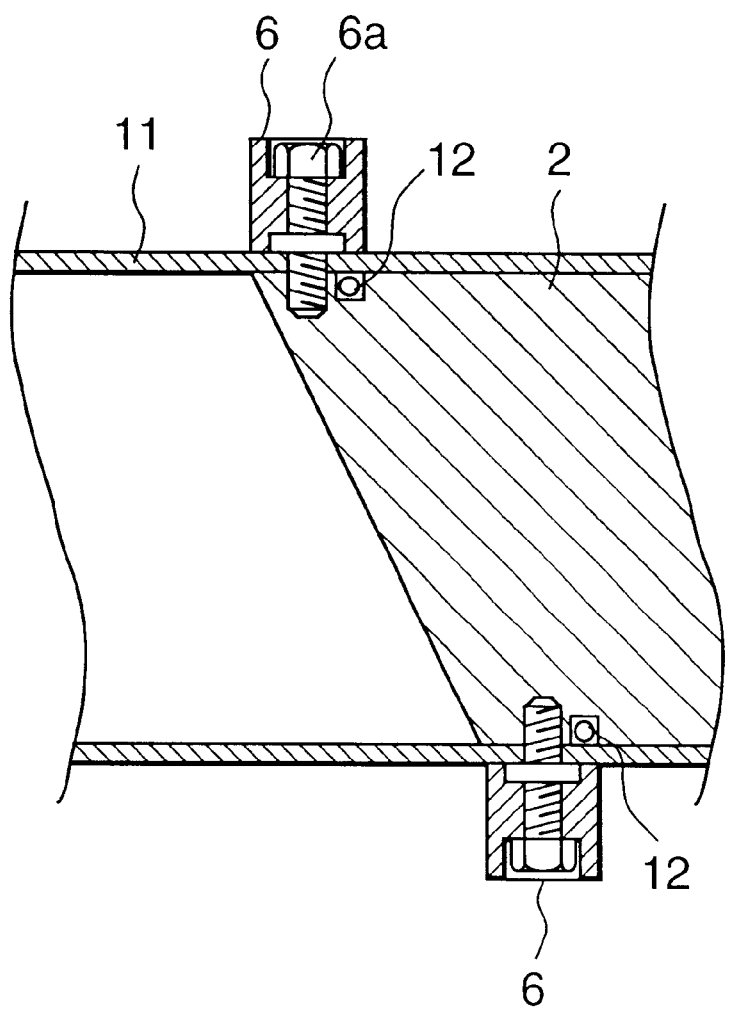
FIG. 7 is a view of a seal portion in detail.

FIG. 7 shows a seal for the annular leaf springs 11.

In the optical element moving mechanism according to the present invention, a fluid is supplied to or exhausted from the driving fluid sealing portion 30 through a joint 18, thereby driving the movable table 1. Therefore, a seal mechanism needs to be provided to prevent leakage of the fluid from the driving fluid sealing portion 30 comprised of the two annular leaf springs 11, movable table 1, and stationary table 2.

In this seal mechanism, the O-rings 12 can be fitted in grooves formed in the movable table 1 and stationary table 2, and the annular leaf springs 11 can be urged against the O-rings 12 by the leaf spring retainers 6 and screws 6a. The leaf spring retainers 6 are annular so that the effective lengths (radial lengths) of the annular leaf springs 11 are constant throughout the entire circumference, in other words, such that they can restrain the annular leaf springs 11 throughout the entire circumference. Those surfaces of the leaf spring retainers 6 which come into contact with the annular leaf springs 11 are formed with grooves in order to fix the annular leaf springs 11 to be as uniform as possible.

Figure 8:
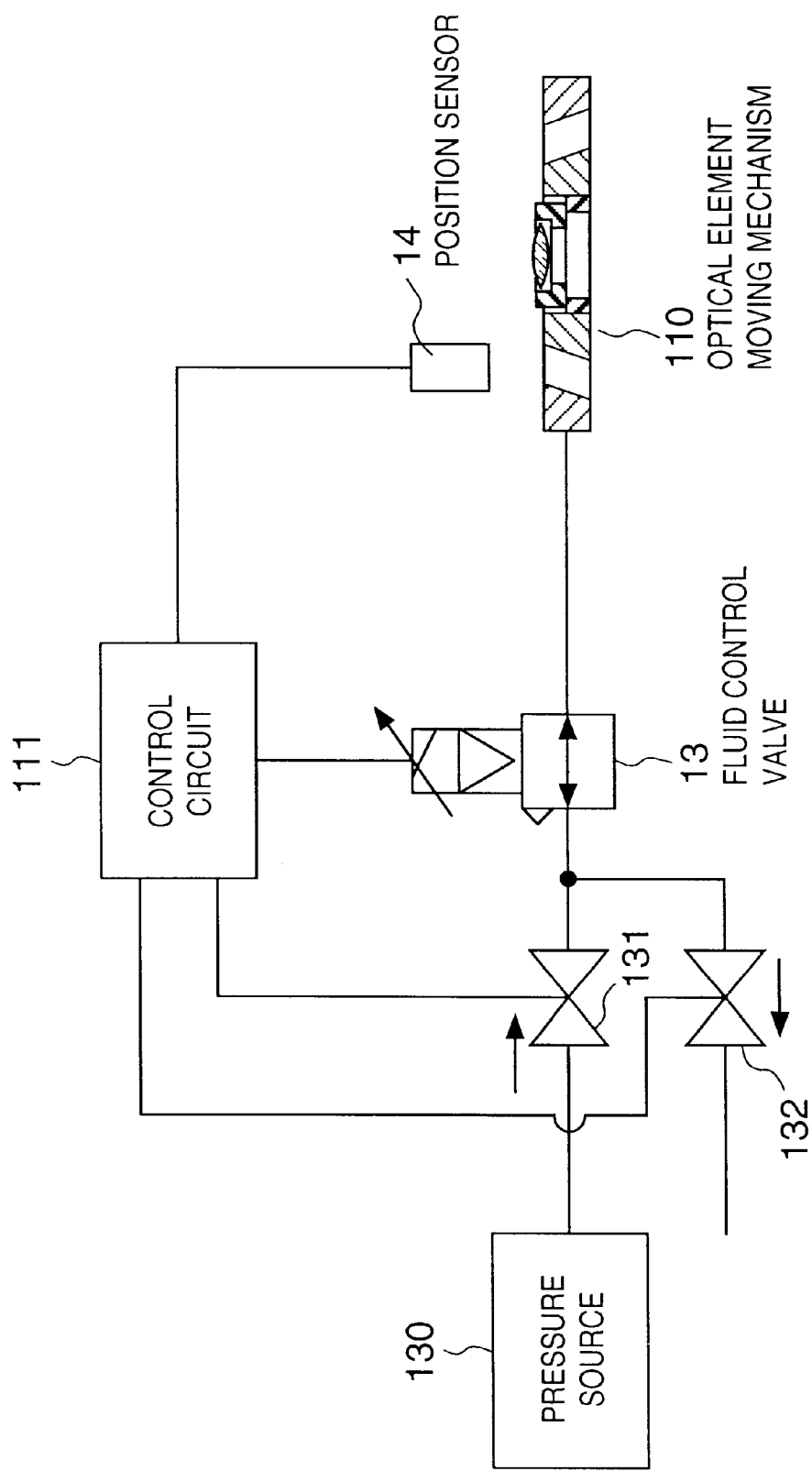
FIG. 8 is a view showing a fluid control system.

FIG. 8 shows the arrangement of a fluid control system according to this embodiment.

In order to control the position of the movable table 1 of the optical element moving mechanism 110, in the fluid control system, the position (or displacement) of the adjustment lens 7 is monitored by a position (or displacement) sensor 14, and a signal corresponding to a deviation between the current position and the target position is output from the control circuit 111 to a fluid control valve 13. Furthermore, the volume in the driving fluid sealing portion 30 or the pressure of the fluid is adjusted by the fluid control valve 13 to control the position of the movable table 1. One port of the fluid control valve 13 is connected to the joint 18 of the optical element moving mechanism 110, and the other port thereof is connected to the ports of valves 131 and 132. The other port of the valve 131 is connected to a pressure source 130 for supplying a pressurized fluid. The other port of the valve 132 communicates with a fluid recovery unit or an outer space (atmosphere). When supplying the fluid to the optical element moving element 110, the control circuit 111 closes the valve 132 and opens the valve 131, or opens the valve 132 and closes the valve 131. The control circuit 111 controls the fluid control valve 13 on the basis of the deviation between the output (current position) and the target position of the position sensor 14.

Figure 9:
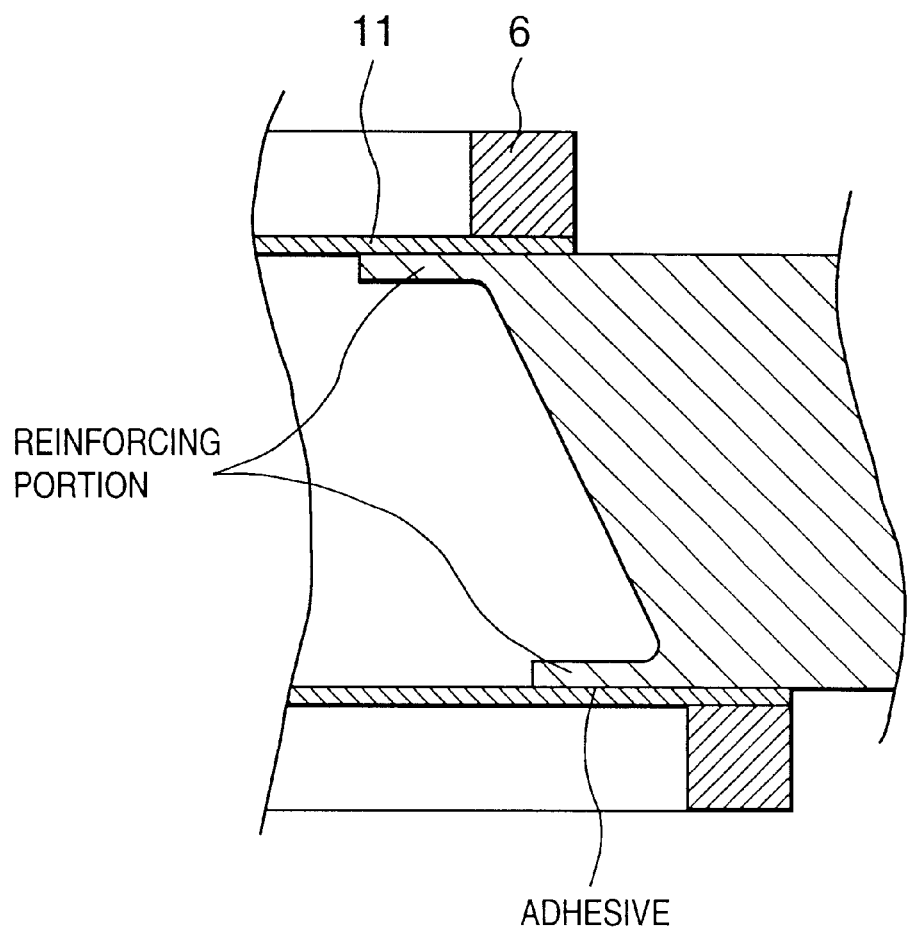
FIG. 9 is a view showing an improvement for relaxing the stress of the leaf springs.

In order to reduce the stress acting on the contacts where the annular leaf springs 11, movable table 1, and stationary table 2 attach to each other, these contact portions may be machined for reinforcement, as shown in FIG. 9. In this case, the inner diameters a1 and a2 of the stationary table 2 and the outer diameters b1 and b2 of the movable table 1 are determined by the substantial deformation positions of the annular leaf springs 11.

When the optical axis is set parallel to the direction of gravity, the annular leaf springs 11 are deformed by the movable mass including the movable table 1, and deform from their neutral positions (positions where the heights of the movable table 1 and stationary table 2 are equal and the leaf springs 11 are not deformed) to mechanical lowermost points (positions where the movable mass balances with the spring constant of the leaf springs).

When the optical element moving mechanism has a structure according to equation (3) as shown in FIG. 3A, the movable table 1 is further displaced from the mechanical lowest point in the direction of gravity by controlling the fluid. With this condition, the optical element moving mechanism can be operated without accompanying eccentricity or angular displacement described above. However, while the pressure of the fluid does not act on the interior of the driving fluid sealing portion 30, the operation of the optical element moving mechanism already accompanies the displacement of the leaf springs from the neutral positions down to the mechanical lowest point. Therefore, when the stress limit that takes into account the safety factor of the annular leaf springs is considered, the operation range is sometimes limited.

When the optical element moving mechanism has a structure according to condition (4) as shown in FIG. 3B, the movable table 1 displaces from the mechanical lowest point through the neutral positions of the leaf spring 11. In the actual mechanism, the positions where the annular leaf springs 11 are constrained tend to change near their neutral positions due to the dimensional error or assembly error of the stationary table 2 for fixing leaf springs 11, the movable table 1, and the leaf spring retainers 6. This change in constraint position appears as the eccentricity of angular displacement of the movable table 1. Therefore, this structure is effective when the precision allowable range of the movement of the movable table 1 must be comparatively wide and the operation range must be wide. If the eccentricity and angular displacement cannot be allowed, the movable table 1 desirable has an offset exceeding the neutral positions of the leaf springs.

Figure 10A:
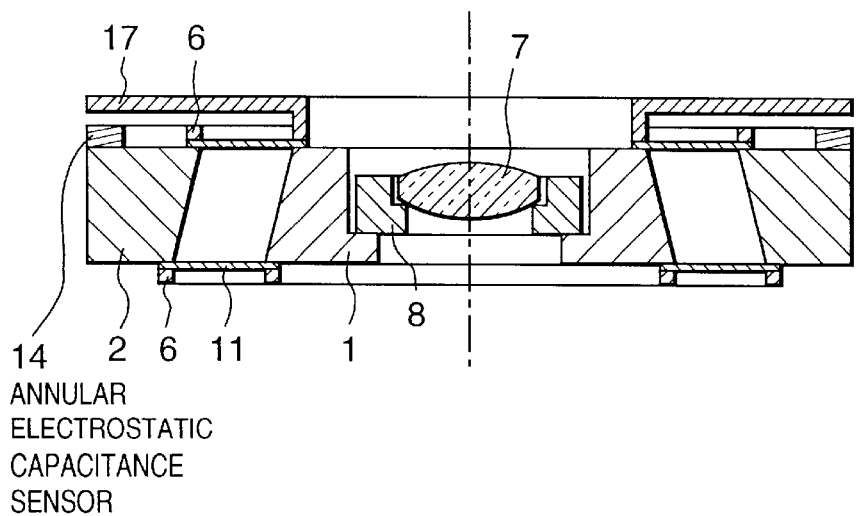
FIGS. 10A and 10B are schematic views of an annular electrostatic capacitance sensor.
Figure 10B:
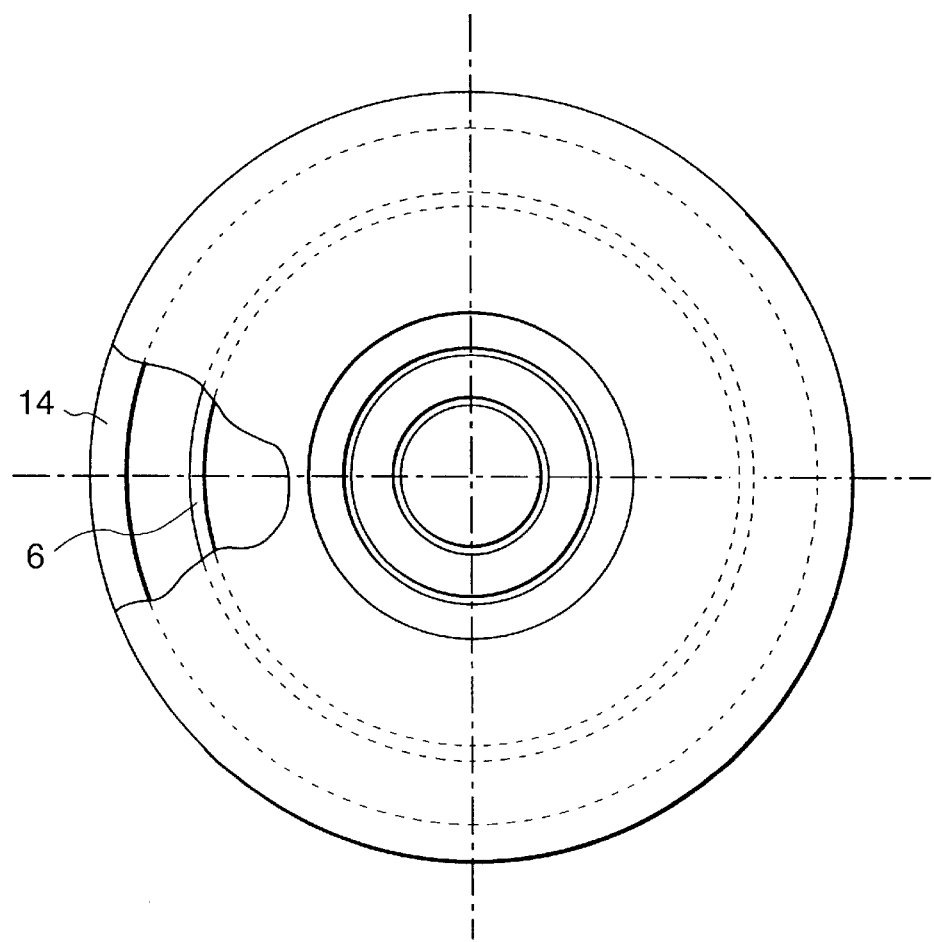

FIGS. 10A and 10B show an example of a displacement measurement unit for measuring the displacements of the movable table land stationary table 2 relative to each other.

An annular electrostatic capacitance sensor 14 having an annular electrode is fixed to the outer periphery of the stationary table 2. An annular target 17 conforming to the shape of the electrostatic capacitance sensor 14 is fixed to the movable table 1. The target 17 is made of a metal and serves also as a member for fixing the corresponding leaf spring 11 to the movable table 1. The electrostatic capacitance changes depending on the distance between the electrode and the target 17. Accordingly, the position of the movable table 1 with respect to the stationary table 2 can be measured by detecting this change in electrostatic capacitance. When the electrode is annularly arranged around the movable table 1 in this manner, the area of the electrode can be increased, and a change in electrostatic capacitance which accompanies the movement of the movable table 1 can be increased, so that the position detection precision can be improved. Since the electrostatic capacitance sensor is used, the detection range of the displacement in positions of the movable table 1 and stationary table 2 relative to each other can be widened. Since the electrode surrounds the lens 7, the adverse influence caused by a change in posture of the movable table 1 during movement is reduced, and the position (displacement) of the central portion of the lens 7 in the direction of the optical axis can be measured.

The position detection method according to the present invention can be applied to other optical elements used in the exposure apparatus, and can also be applied to, e.g., a lens driving device for adjusting the distortion, coma, and the like of a projection lens.

When the optical element driving device using the detection method according to the present invention is employed, a driving device having a high driving precision and a wide driving range can be realized, and the performance of the optical system can be improved.

When the components 17 serving as the leaf spring retainers and the target are made of a nonconductive material such as a ceramic material, the target is desirably formed by welding a metal to that portion of the electrostatic capacitance sensor which opposes the electrode, and by electrically grounding this portion.

Figure 11A:
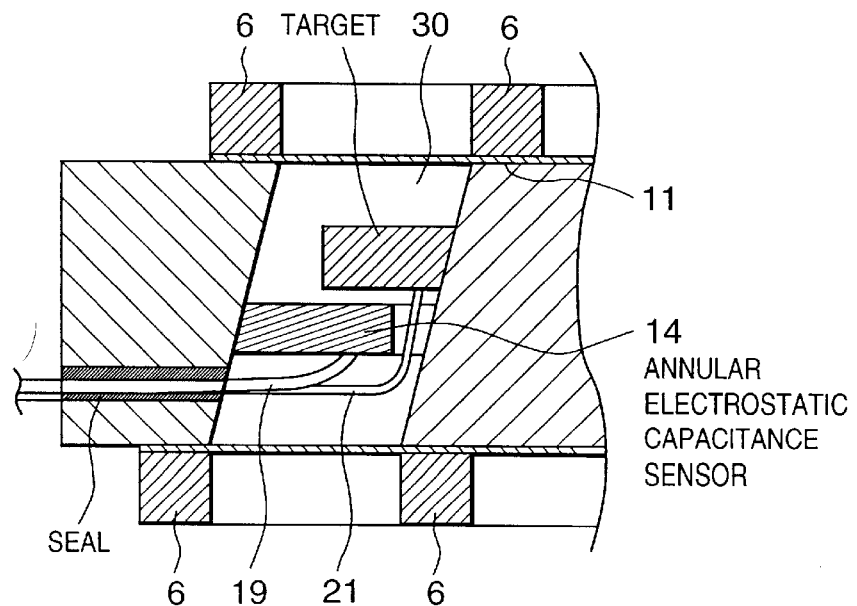
FIGS. 11A and 11B are schematic views of a built-in annular electrostatic capacitance sensor.
Figure 11B:
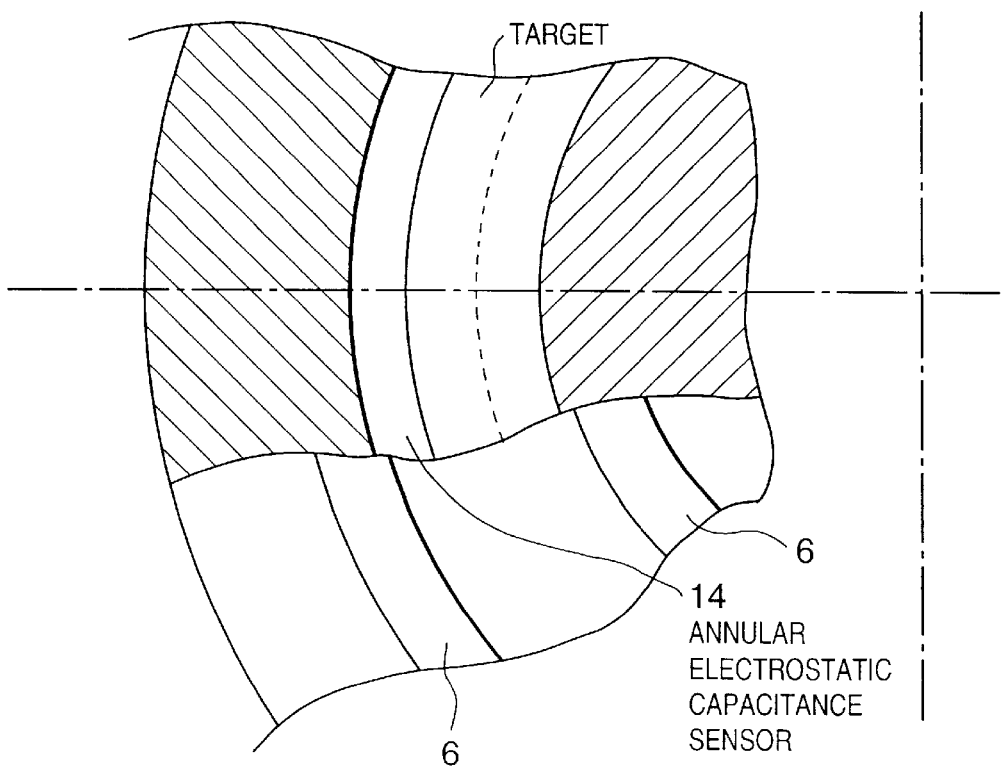

If the annular electrostatic capacitance displacement sensor 14 shown in FIGS. 10A and 10B is arranged in the driving fluid sealing portion 30 as shown in FIGS. 11A and 11B, it provides a high space efficiency. In this case, since a signal line must be connected to the fluid sealing portion 30 to extend to the outside, the portion through which the signal line extends needs to be sealed. If the driving fluid is air and is controlled by a method, e.g., one employing a servo valve, that performs a control operation while constantly monitoring the control amount, a specific amount of leakage, if any, causes no problem in the operation of the mechanism. Therefore, sealing need not be perfect. In this case, the fluid to be supplied may be an inert gas in place of air.

[Second Embodiment]

FIG. 12 is a sectional view of an optical element moving device according to the second embodiment of the present invention.

In this embodiment, in a mechanism identical to that of the embodiment described above, those side surfaces of a movable table 1 and stationary table 2 which oppose each other are machined to have one step or more. The plan view of this embodiment is the same as that of the embodiment described above, and is accordingly omitted.

Figure 13A:
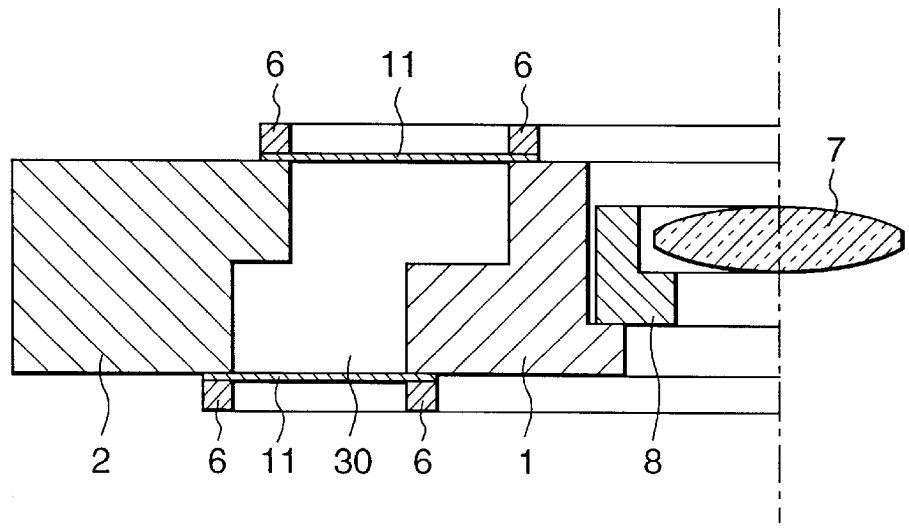
FIGS. 13A and 13B are views for explaining the lengths of leaf springs of the second embodiment.
Figure 13B:
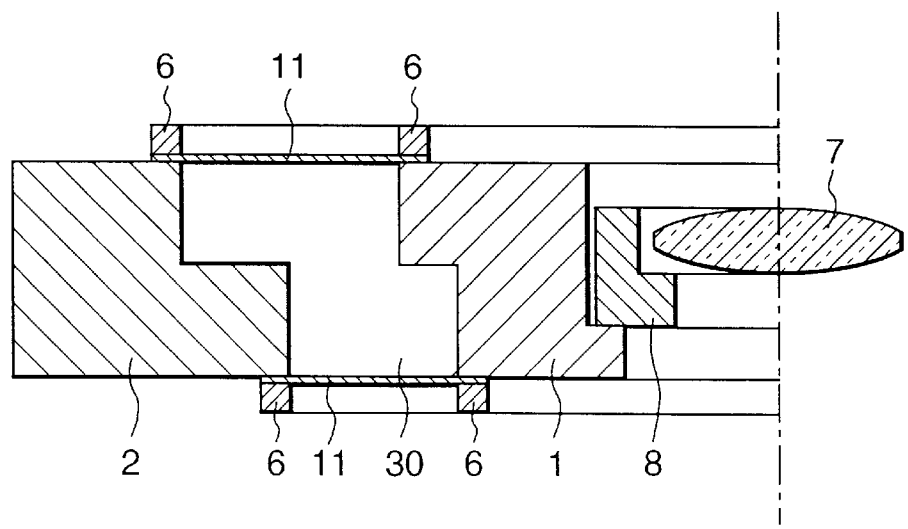

The relationship between the inner and outer diameters of the movable table and stationary table of this embodiment is identical to that of the first embodiment, as shown in FIGS. 13A and 13B.

Figure 14:
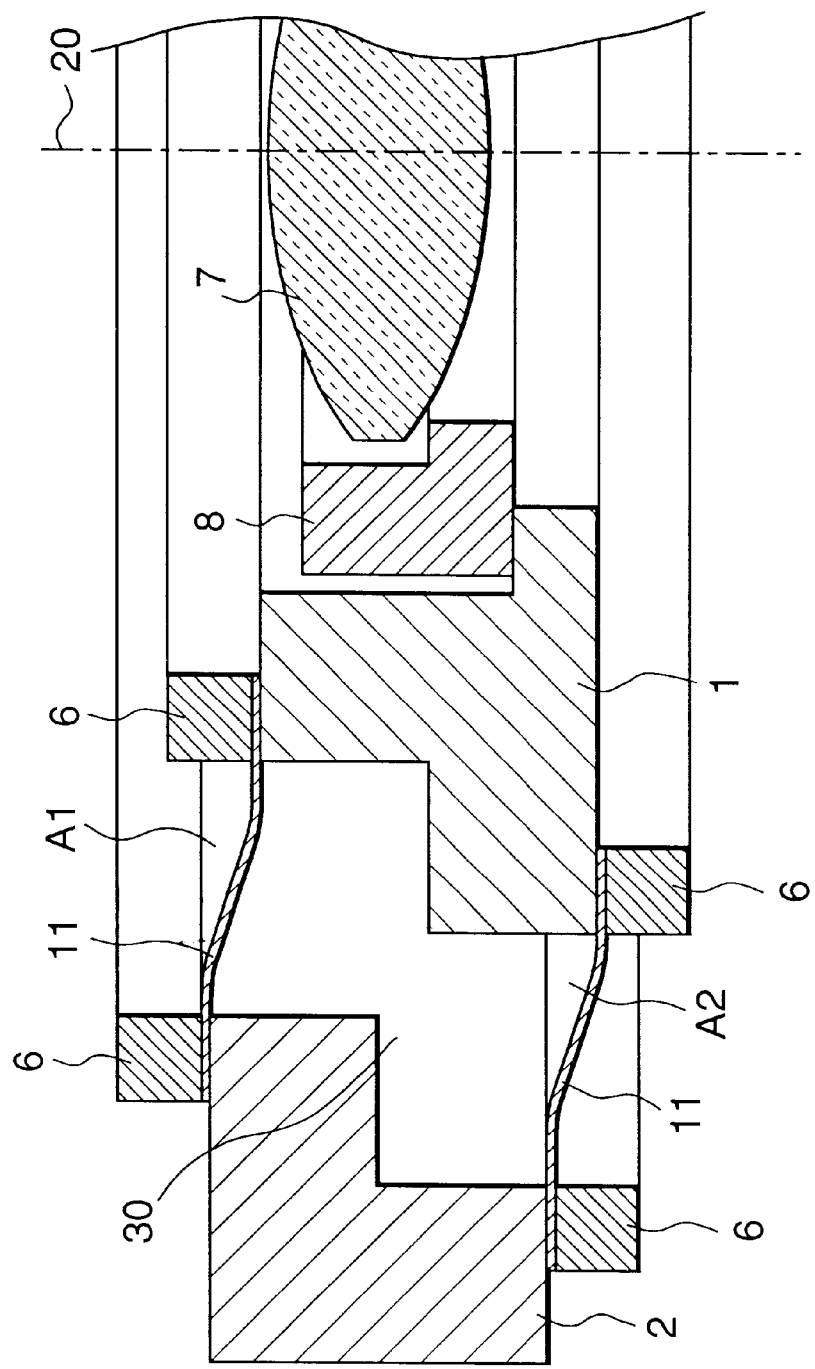
FIG. 14 is a view for explaining the principle of operation of the second embodiment.

Similarly to the first embodiment, the stationary table 2 has at least one hole 28 communicating with a driving fluid sealing portion 30, and the position of the movable table 1 can be changed by changing the pressure of the driving fluid or the volume of the interior of the driving fluid sealing portion 30. This is because since the diameters of two leaf springs 11 are different as shown in FIG. 14, volume change amounts A1 and A2 of the upper and lower portions, respectively, of the space 30 produced by deformation of the leaf springs 11 differ, as shown in FIG. 14.

According to this embodiment, the effect of the first embodiment can be obtained, and the outer side surface of the movable table 1 and the inner side surface of the stationary table 2 can be machined easily.

[Third Embodiment]

Figure 15:
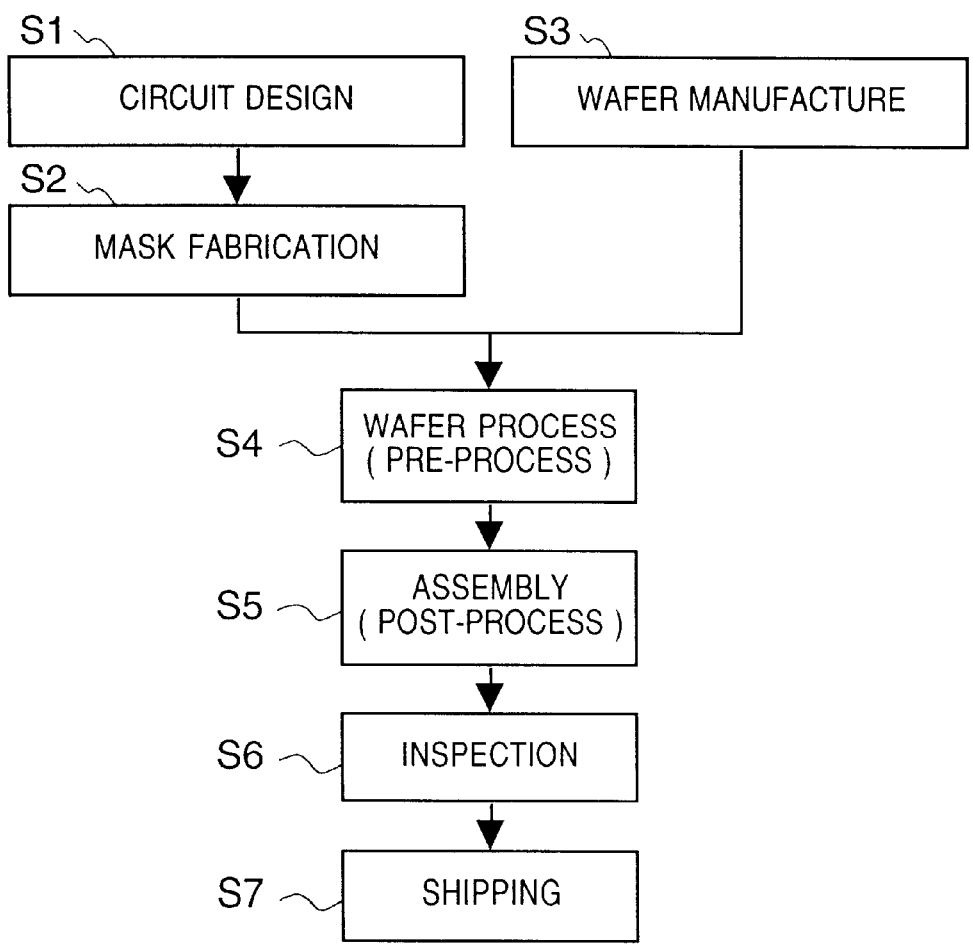
FIG. 15 is a flow chart showing a wafer process.

An embodiment of a semiconductor device manufacturing method using the exposure apparatus having the optical element moving device described above will be described. FIG. 15 shows the flow of the manufacture of a semiconductor device (a semiconductor chip such as an IC or LSI, a liquid crystal panel, a CCD, or the like). In step 1 (circuit design), circuit design of the semiconductor device is performed. In step 2 (mask fabrication), a mask formed with the designed circuit pattern is fabricated. In step 3 (wafer manufacture), a wafer is manufactured by using a material such as silicon. Step 4 (wafer process) is called a pre-process where the mask and wafer prepared in the above manner are used to form an actual circuit on the wafer in accordance with photolithography. Step 5 (assembly) is called a post-process where the wafer fabricated in step 4 is formed into semiconductor chips. Step 5 includes an assembly step (dicing, bonding), a packaging step (chip encapsulation), and the like. In step 6 (inspection), inspection such as an operation confirmation test, a durability test, and the like of the semiconductor device fabricated in step 5 is performed. The semiconductor device is completed through these steps, and is shipped (step 7).

Figure 16:
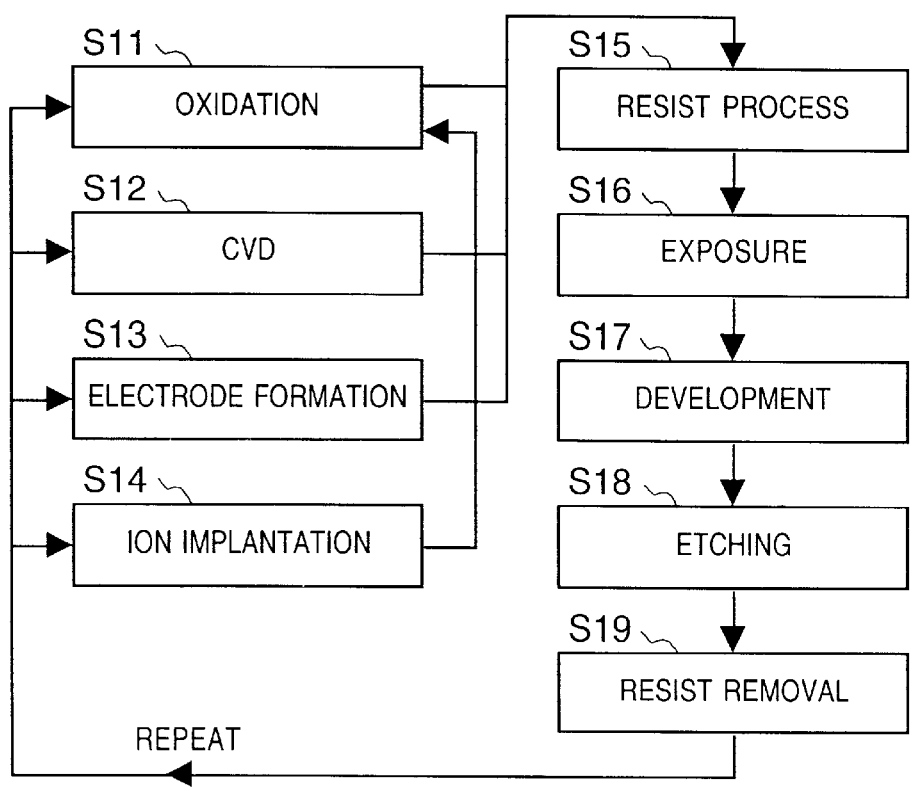
FIG. 16 is a flow chart showing the device manufacture.
Figure 17A:
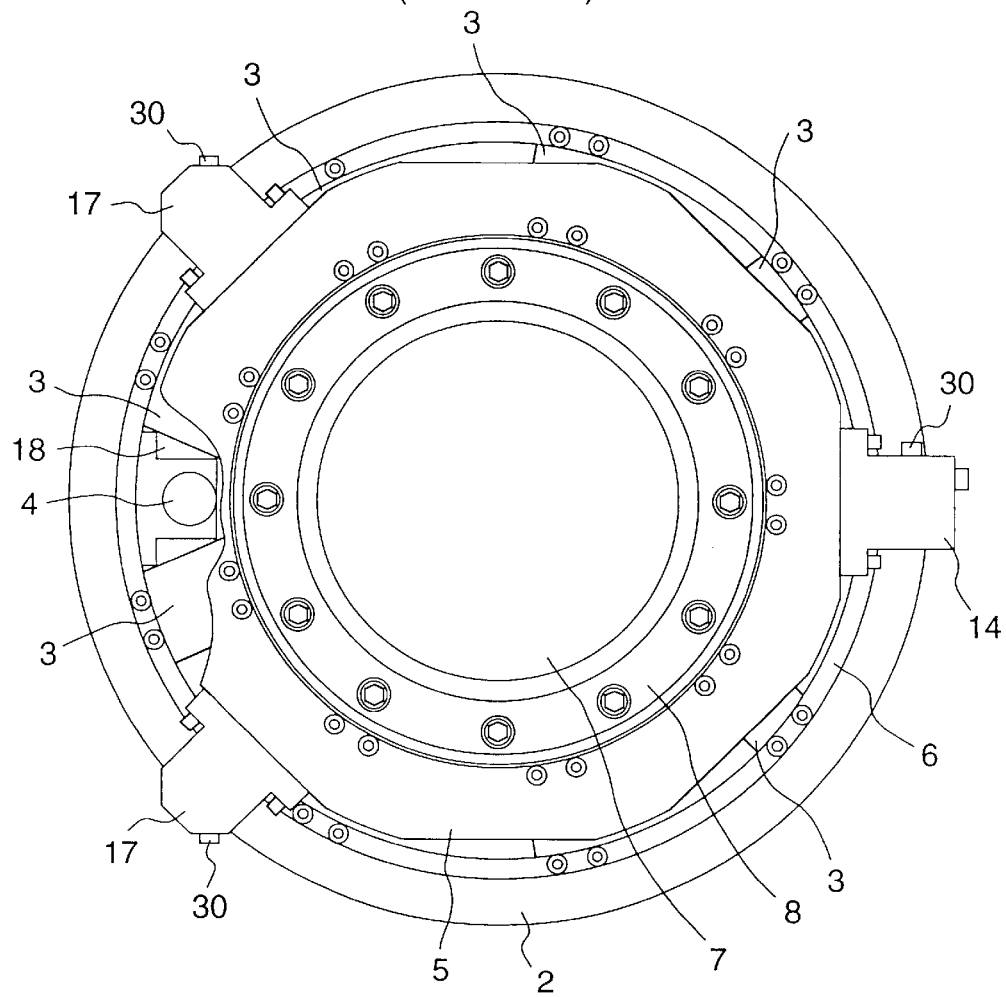
FIGS. 17A and 17B are views showing a conventional optical element moving mechanism.
Figure 17B:
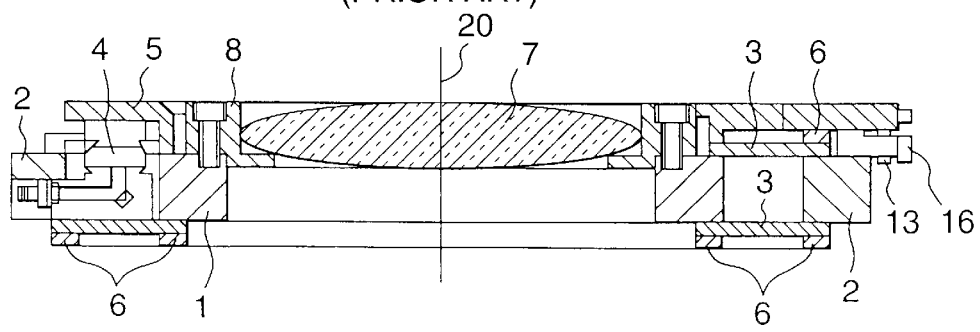
Figure 18:
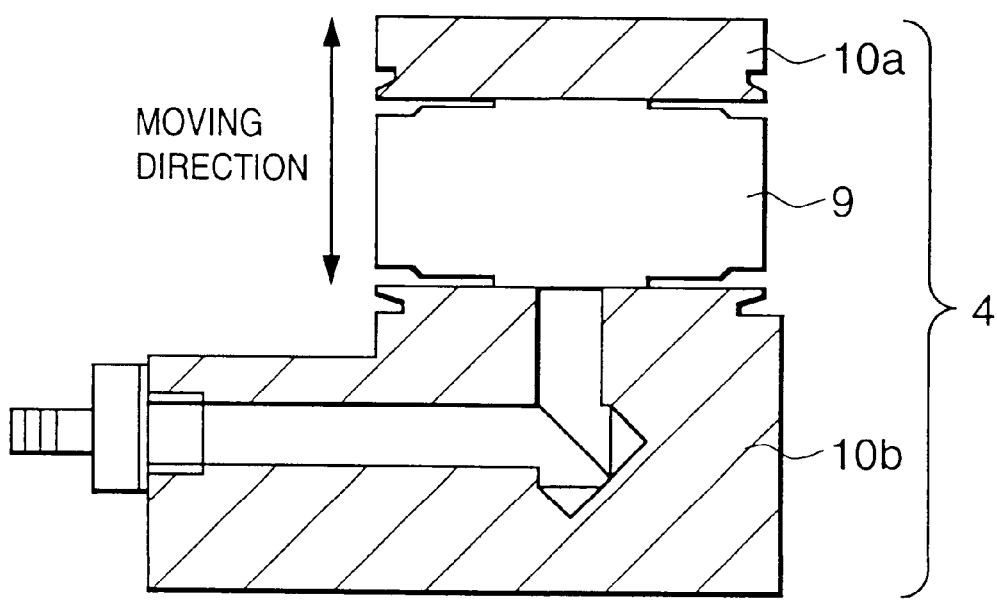
FIG. 18 is a view showing a driving element used in the conventional optical element moving mechanism.

FIG. 16 shows a detailed flow of the above wafer process. In step 11 (oxidation), the surface of the wafer is oxidized. In step 12 (CVD), an insulating film is formed on the wafer surface. In step 13 (electrode formation), electrodes are formed on the wafer by vapor deposition. In step 14 (ion implantation), ions are implanted in the wafer. In step 15 (resist process), a photosensitive agent is applied to the wafer. In step 16 (exposure), the circuit pattern of the mask is printed on the wafer and exposed while adjusting the optical element at an appropriate position by the exposure apparatus described above. In step 17 (development), the exposed wafer is developed. In step 18 (etching), a portion of the wafer other than the developed resist image is removed. In step 19 (resist removal), the resist which has become unnecessary after etching is removed. These steps are repeatedly performed to form circuit patterns on the wafer in a multiple manner. When the manufacturing method of this embodiment is used, a highly integrated semiconductor device which is conventionally difficult to manufacture can be manufactured.

As many apparently widely different embodiments of the present invention can be made without departing from the spirit and scope thereof, it is to be understood that the invention is not limited to the specific embodiments thereof except as defined in the claims.

What is claimed is:

1. A driving device comprising:
    a first member;
    an annular second member arranged outside said first member;
    an annular first plate for connecting said first and second members to each other; and
    an annular second plate for connecting said first and second members to each other,
    wherein said first and second members are moved relative to each other by supplying or exhausting a fluid into or from a space surrounded by said first and second members and said first and second plates, and at least one of (i) an inner diameter a1 of a portion of said second member at which said second member is connected to said first plate is different from an inner diameter a2 of a portion of said second member at which said second member is connected to said second plate and (ii) an outer diameter b1 of a portion of said first member at which said first member is connected to said first plate is different from an outer diameter b2 of a portion of said first member at which said first member is connected to said second plate.

2. The device according to claim 1, wherein a volume in said space changes as said first and second members move relative to each other.

3. The device according to claim 1, wherein said first and second members move relative to each other in a direction substantially parallel to an axial direction of said annular second member.

4. The device according to claim 1, wherein (a1−b1) and (a2−b2) are substantially equal to each other.

5. The device according to claim 1, wherein the fluid includes an inert gas.

6. The device according to claim 1, further comprising a pressure control valve for controlling a pressure in the space.

7. The device according to claim 1, further comprising a sensor for detecting a relative distance or displacement between said first and second members.

8. The device according to claim 7, further comprising a pressure control valve for controlling a pressure in the space, said pressure control valve being controlled on the basis of an output signal from said sensor.

9. The device according to claim 7, wherein a target for said sensor has an annular shape.

10. The device according to claim 7, wherein a fixing member for fixing either one of said first and second plates to either one of said first and second members also serves as a target for said sensor.

11. The device according to claim 10, wherein said fixing member has a portion formed by welding a metal to a nonconductive material.

12. The device according to claim 7, wherein said sensor is arranged in the space.

13. The device according to claim 7, wherein said sensor has an electrostatic capacitance sensor.

14. The device according to claim 1, wherein said first member has a step structure on an outer side surface thereof.

15. The device according to claim 1, wherein said second member has a step structure on an inner side surface thereof.

16. The device according to claim 1, wherein said first and second members move relative to each other within a range having as one boundary a position where rigidity of said first and second plates and a mass of at least one of said first and second members balance with each other.

17. The device according to claim 1, wherein said first and second members move relative to each other within a range including a position where rigidity of said first and second plates and a mass of at least one of said first and second members balance with each other.

18. An exposure apparatus comprising:
    a driving device, according to claim 1, for driving an optical element; and
    a substrate support for supporting a substrate,
    wherein the substrate is exposed to a mask using exposure light.

19. A device manufacturing method comprising the steps of:
    exposing a substrate by using an exposure apparatus that includes the driving device according to claim 1; and
    developing the exposed substrate.

20. The device according to claim 1, wherein either one of two conditions is satisfied where
    the first condition is a1>a2 and b2>b2, and
    the second condition is a1<a2 and b1<b2.

21. A driving device comprising:

a first member;

an annular second member, said first member being arranged inside said second member;

an annular first plate for connecting said first and second members to each other;

an annular second plate for connecting said first and second members to each other, wherein said first and second members are moved relative to each other by increasing or decreasing a fluid within a space surrounded by said first and second members and said first and second plates.

22. The device according to claim 21, wherein said first member has an annular shape.

23. The device according to claim 21, wherein said first and second members are moved, relative to each other, in a direction substantially perpendicular to an annular surface of said second member.

24. The device according to claim 21, wherein said first member supports an optical element, and said first and second members are moved, relative to each other, in a direction substantially parallel to an axis of said optical element.

25. An exposure apparatus comprising:

at least one optical element;

a driving device, according to claim 21, for driving said at least one optical element; and a substrate support for supporting a substrate, wherein said exposure apparatus is arranged to expose the substrate with light from a mask.

26. A device manufacturing method comprising the steps of:

exposing a substrate by using an exposure apparatus according to claim 25; and developing the exposed substrate.

27. A driving device comprising:

a first member; and an annular second member, said first member being arranged inside said second member, wherein said first and second members are moved relative to each other by increasing or decreasing a fluid within a space formed between said first and second members.

28. The device according to claim 27, wherein said first member has an annular shape.

29. The device according to claim 27, wherein said first and second members are moved, relative to each other, in a direction substantially perpendicular to an annular surface of said second member.

30. The device according to claim 27, wherein said first member supports an optical element, and said first and second members are moved, relative to each other, in a direction substantially parallel to an axis of said optical element.

31. An exposure apparatus comprising:

a driving device, according to claim 27, for driving said at least one optical element; and a substrate support for supporting a substrate, wherein said exposure apparatus is arranged to expose the substrate with light from a mask.

32. A device manufacturing method comprising the steps of:

exposing a substrate by using an exposure apparatus according to claim 31; and developing the exposed substrate.

33. An exposure apparatus comprising:

a first member;

a second member having an annular shape, said first member being arranged inside said second member;

a first elastic member having elasticity and connecting said first member and said second member;

a second elastic member having elasticity and connecting said first member and said second member; and a driving mechanism arranged to allow said first member to move relative to said second member by increasing and/or decreasing a fluid within a space surrounded by said first member, said second member, said first elastic member, and said second elastic member.

34. The apparatus according to claim 33, wherein each of said first elastic member and said second elastic member comprises a leaf spring.

35. The apparatus according to claim 33, wherein said second member is in substantial axial symmetry with respect to an axis and said driving mechanism is arranged to move said first member relative to said second member in a direction parallel to a direction of the axis.

36. A device manufacturing method comprising:

exposing a substrate by using an exposure apparatus according to claim 33; and developing the exposed substrate.

* * * * *